US006265901B1

United States Patent
Stern et al.

(10) Patent No.: US 6,265,901 B1
(45) Date of Patent: Jul. 24, 2001

(54) FULLY DIFFERENTIAL LOGIC OR CIRCUIT FOR MULTIPLE NON-OVERLAPPING INPUTS

(75) Inventors: Kenneth J. Stern, Newton; Vincenzo DiTommaso, Arlington, both of MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/448,121

(22) Filed: Nov. 24, 1999

(51) Int. Cl.[7] .................................................. H03K 19/086
(52) U.S. Cl. ............................ 326/126; 326/112; 326/127
(58) Field of Search ................................. 326/126, 127, 326/112, 119, 121; 327/405, 407, 408, 410, 411

(56) References Cited

U.S. PATENT DOCUMENTS 5,668,495 * 9/1997 Vora et al. ............................ 327/432
6,093,981 * 7/2000 Cali' et al. ............................. 307/113
6,137,340 * 10/2000 Goodell et al. ....................... 327/407

OTHER PUBLICATIONS

Data Sheet for Motorola Part No. ML10EL05, (1996).
Data Sheet for Motorola Part No. MECL 10K (1996).
Data Sheet for Motorola Part No. MC10H164 (1996) 8–Line.

* cited by examiner

*Primary Examiner*—Michael Tokar
*Assistant Examiner*—Anh Tran
(74) *Attorney, Agent, or Firm*—Koppel & Jacobs

(57) ABSTRACT

A high speed, multiple input restrictive OR circuit with fully differential inputs and output is used in applications in which only one input can be active at a time. N differential voltage inputs are converted into N corresponding differential current signals of unit current values. The current signals corresponding to active complement input signals are summed together, with a compensation current equal to (N−1) current units subtracted from the total. The resulting compensated complement currents together with any active input current form a single differential current that indicates the logic state at the input. This differential current is preferably converted to a buffered output differential voltage in an output stage. For high accuracy applications, a common unit reference current is used to generate both a scaled compensation current and unit input stage source currents.

15 Claims, 3 Drawing Sheets

FULLY DIFFERENTIAL LOGIC OR CIRCUIT FOR MULTIPLE NON-OVERLAPPING INPUTS

BACKGROUND OF THE INVENTION

1. Field of the Invention

This invention relates to a multiple input restrictive logic OR circuit and more particularly to a high speed fully differential logic OR circuit with multiple non-overlapping inputs.

2. Description of the Related Art

When designing systems such as automated test equipment it is desirable to provide a high speed logic circuit which accepts numerous inputs and provides a single output, where only one input at a time is active and the output is active when one of the inputs is active. In such high speed applications, input-to-output propagation delays must be minimized while remaining uniform for each input. It is also desirable to minimize signal noise and interaction between circuit devices that may degrade the signal.

Differential logic OR circuits have been developed using known ECL technology such as the differential two input Motorola MC10EL05. However, these circuits commonly have only 2 or 3 inputs which suffer from different input-to-output propagation delays. In addition, to construct a logic OR circuit with more inputs, for example 8, several 2 or 3 input OR circuits must be coupled together in a tree structure. Such tree structures have different input to output propagation delays for the different inputs depending on the path taken through the logic tree. They also result in undesirable interaction between the multiple logic gates, which can degrade the signals.

A multi-input logic OR circuit could also be implemented with a "Wired-OR" circuit, in which single-ended input lines are combined to produce an "OR" output. An example of this approach is embodied in the Motorola MECL 10K 4 input wired-OR logic gate. This circuit has relatively low propagation delay and is generally symmetric with respect to propagation delay between input and output. However, its single-ended inputs make the circuit susceptible to jitter and makes propagation delay sensitive to environmental changes.

A multi-input logic OR circuit could also be implemented with a multiplexer that selects data from one of the multiple input lines and directs the data to a single output line. An example of this approach is embodied in the Motorola MC10H164 8-line multiplexer. The selected input line is activated by control lines and the number of control lines increases as the number of inputs increase. A four input multiplexer requires two control lines, while an eight input multiplexer requires three control lines. These circuits suffer from undesirable input-to-output propagation delays and experience an additional delay in the settling time of the control lines. The necessity for control lines makes this approach significantly more complex.

SUMMARY OF THE INVENTION

The present invention is a superior method and device for providing a high speed restrictive logic OR function with multiple fully differential inputs, for use in applications where only one of the multiple inputs is active at one time. The circuit inputs experience very small input-to-output propagation delays, with each of the inputs seeing the same propagation delay. The differential inputs minimize jitter and provide for a small transition time during which the inputs change states from active to inactive or vice versa. The invention also provides a differential output, eliminating the need for associated invert functions at the output. The circuit is implemented without the need for control lines.

The new logic circuit accepts multiple differential inputs, each comprising an input signal and its complement. At the input circuit, the differential input voltage signals are converted to respective differential current signals. The differential currents from the differential voltage inputs are then coupled to an output circuit which indicates whether one of the inputs is active.

Any active input signal is converted to an active current unit and any active complement input signal is converted to a complement current unit of equal magnitude. The complement current units are summed together and an opposing current of (N−1) current units subtracted from the sum, where N is the total number of inputs. The difference, which is equal to zero if none of the input signals is active and to one current unit if one of the input signals is active. The output currents are preferably converted to an output differential voltage that produces an active output when one of the inputs is active, and a complemented output when none of the inputs is active.

To enhance the invention's accuracy and reduce the potential for mismatches between different paths, a common reference current can be used to derive both the opposing current of (N−1) current units and the active and complemented differential transistor currents. This ensures that the opposing current closely matches the summed complement currents when one of the inputs is active. Specifically, if an input is active the summed complement currents will be (N−1)current units. Using the same unit reference current for the opposing current of (N−1) current units results in a net zero output current.

These and other further features and advantages of the invention will be apparent to those skilled in the art from the following detailed description, taken together with the accompanying drawings.

DETAILED DESCRIPTION OF THE INVENTION

Figure 1:
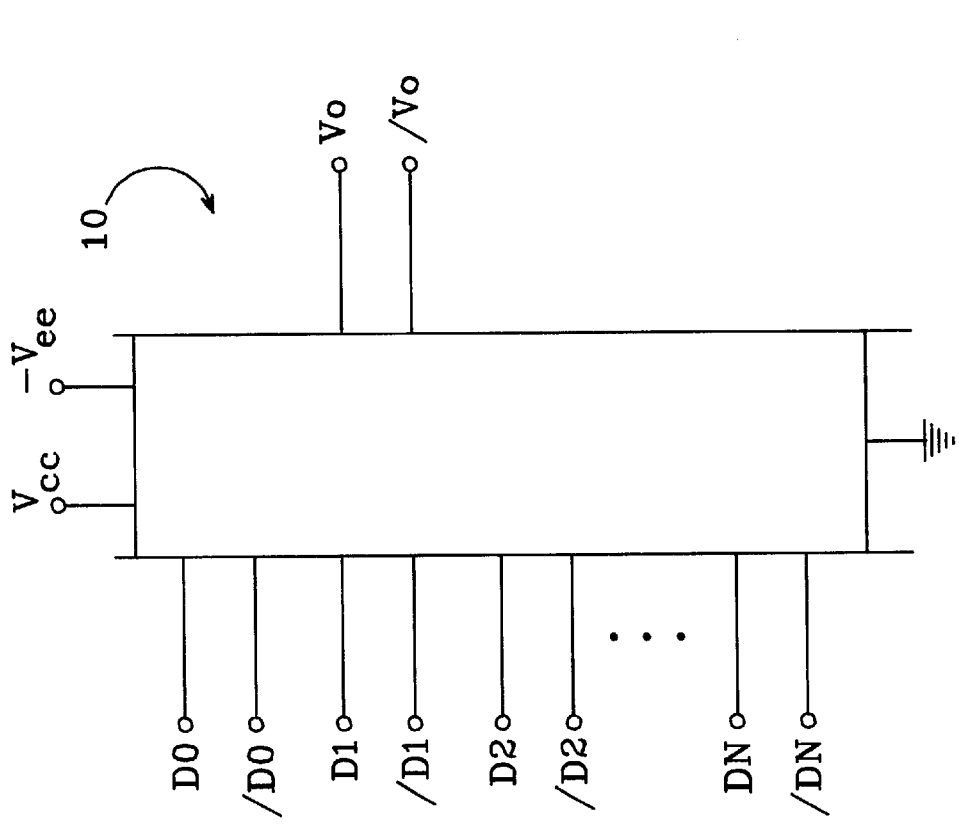
FIG. 1 is an input/output block of the invention showing multiple differential inputs and a single differential output.

FIG. 1 shows the input/output block 10 of the new restrictive logic OR circuit. The circuit accepts multiple differential inputs consisting of inputs D0–DN and their complements /D0–/DN, and is only used in applications in which only one of the multiple differential inputs D0–DN can be active at one time. The circuit also provides a differential output, consisting of output voltage Vo and its complement /Vo. While in the preferred embodiment the output is a differential voltage, it could also be a differential current. The invention is a fully differential OR gate in which the output Vo is active only if one the multiple differential inputs D0–DN is active.

Figure 2:
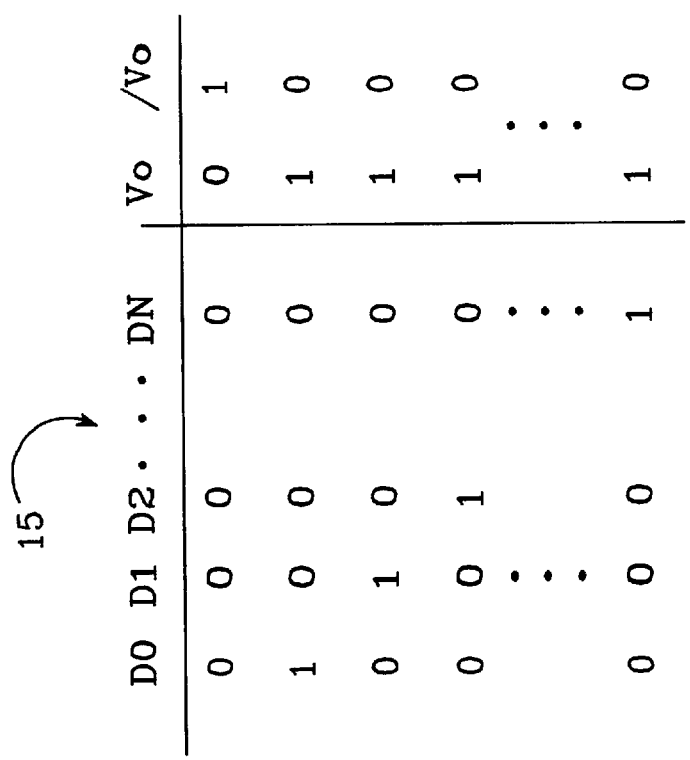
FIG. 2 is a logic table showing the potential input states and the corresponding output states.

FIG. 2 is an input/output table 15 showing the possible input states and the corresponding output states. The columns labeled D0–DN represent the circuit inputs and the columns labeled Vo and /Vo represent the output and its complement. Vo is active whenever one of the inputs is active; /Vo is active if none of the inputs is active.

Figure 3:
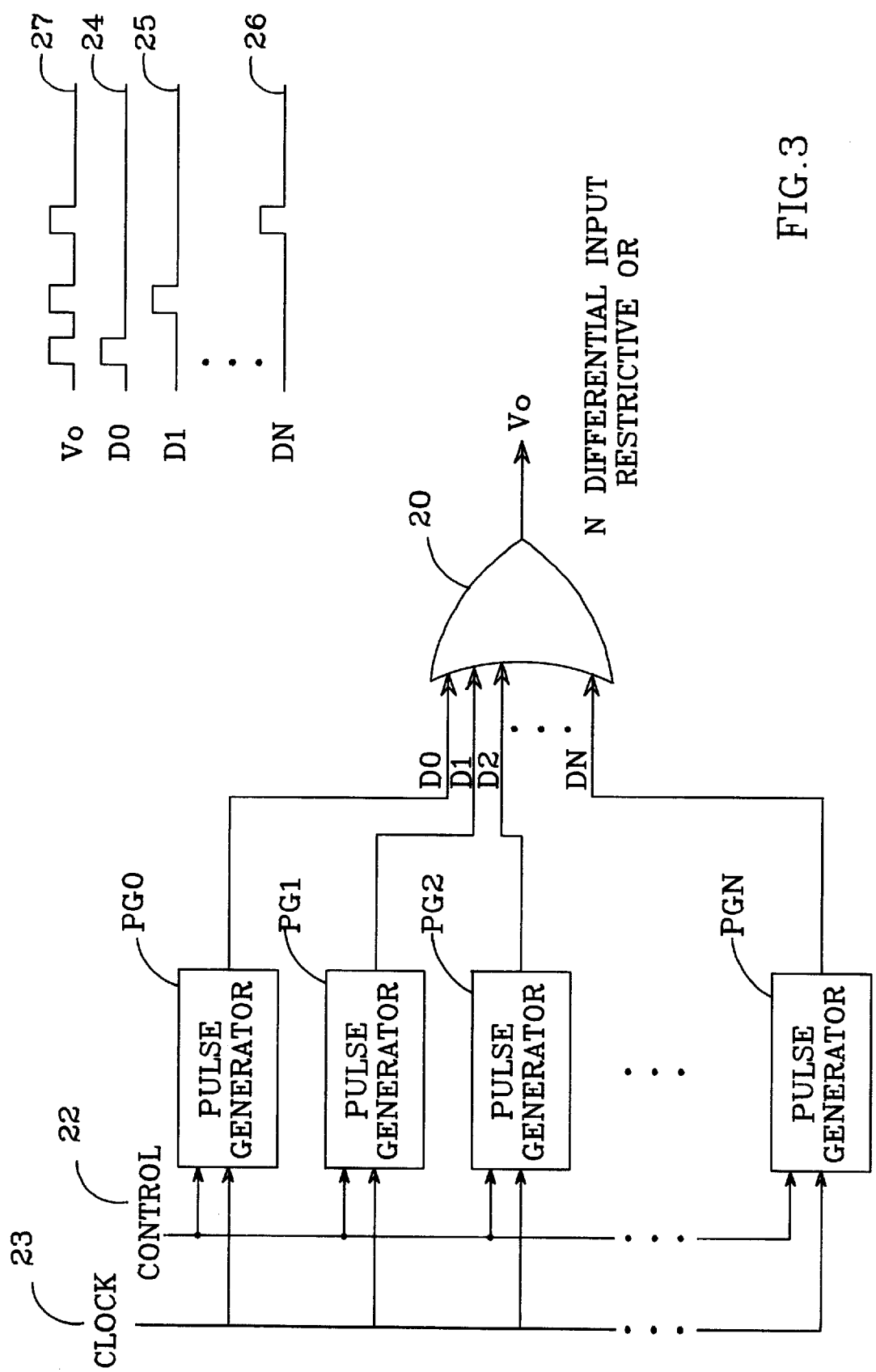
FIG. 3 is a schematic diagram of an embodiment of the present invention within a system that generates a fast pulse train.

FIG. 3 shows the present invention as part of a high speed pulse train generator. The differential outputs of pulse generators PG0–PGN are connected to the differential inputs D0–DN of the new N differential input restrictive OR circuit 20. Only one of the pulse generators PG0–PGN generates a pulse at one time depending on the state of control lines 22. The pulse generators PG0–PGN also accept a timing clock input 23.

The timing diagrams 24–26 show the output of the pulse generators with only one being active at any one time. The restrictive OR circuit 20 generates a high speed pulse train output Vo from the pulses of the individual pulse generators PG0–PGN, as shown in timing diagram 27. The resulting high speed pulse train is a series of pulses that occur at a much higher speed than could be produced by a single pulse generator.

Figure 4:
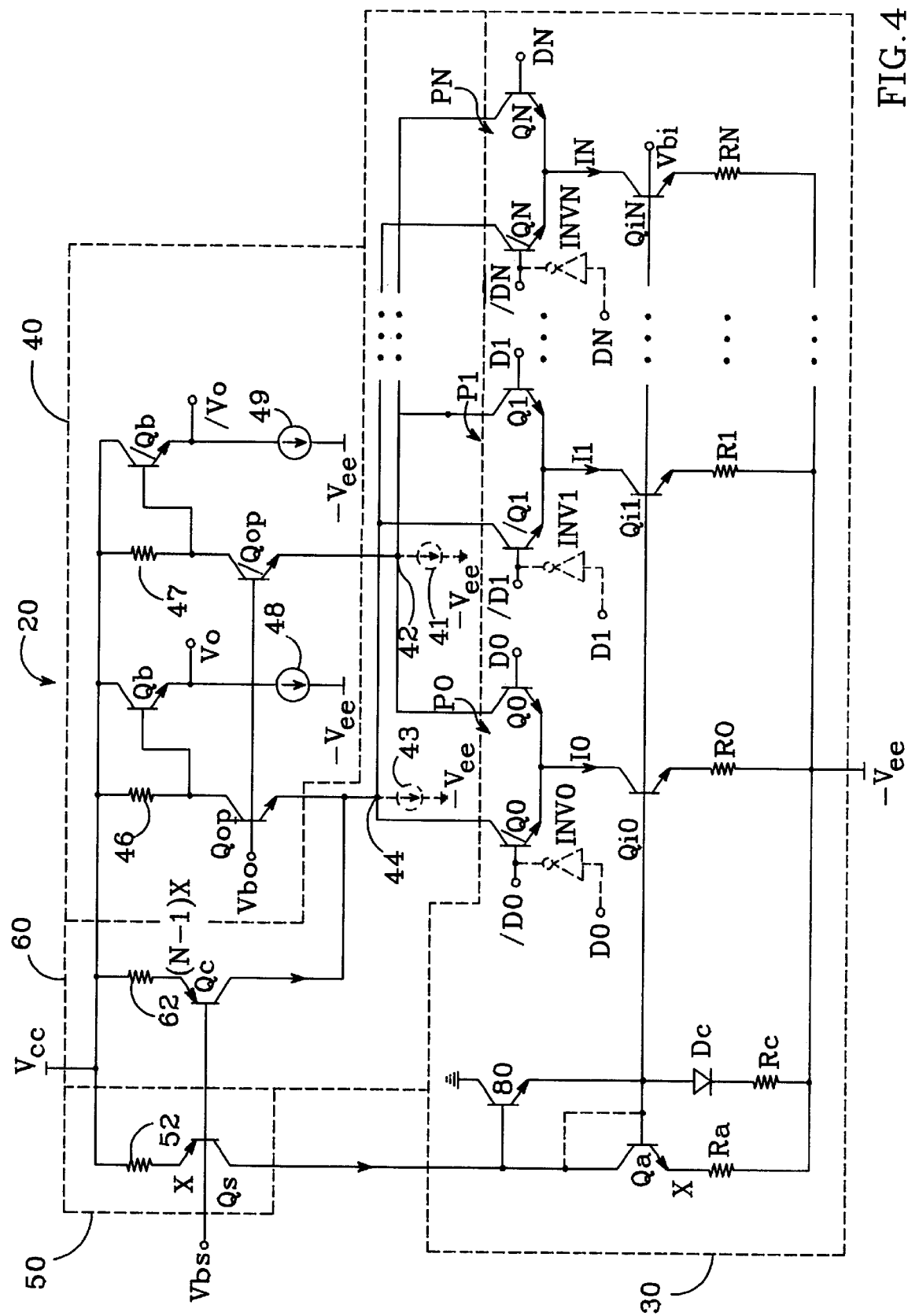
FIG. 4 is a schematic diagram of one embodiment of the invention.

FIG. 4 is a schematic diagram of circuit details of a preferred embodiment of the invention. While a specific circuit is shown, it could be modified in various ways without departing from the invention. For example, the bipolar transistors shown could be reversed (npn vs. pnp) with a corresponding adjustment in voltage supplies. Accordingly, the circuit shown is for illustration only, and is not intended to limit the invention.

The invention 20 can be conceptually divided into several stages as indicated by dashed lines. An input stage 30 includes multiple differentially connected input transistor pairs P0, Pl, . . . , PN consisting of npn bipolar transistors Q0-/Q0, Q1-/Q1, . . . , QN-/QN. Differential input signals D0-/D0, D1-/D1, . . . , DN-/DN are applied to the bases of transistors Q0-/Q0, Q1-/Q1, . . . , QN-/QN, respectively. Only one of inputs D0–DN is active at any given time. An output stage 40 provides output Vo and its complement /Vo, the output being active when one of the inputs is active and its complement being active when none of the inputs is active. A bias voltage Vbs provides a reference for the current source 50, which insures that the currents in input stage 30 are properly scaled to the current in conversion stage 60. Current source 50 may be implemented as a pnp transistor QS with its emitter connected to the positive supply bus Vcc through a resistor 52, its base set at a bias voltage Vbs which keeps the transistor conductive, and its collector supplying a reference current for the input stage. The current source generates a current whose value will be referred to as a unit current (preferably about 0.5 mA, but can vary depending on the process used). The unit current is the same as the input current I0–IN coupled to the differential transistor pairs P0–P1.

A conversion stage 60 converts the pattern of differential input voltages to a differential current drive for the output stage 40 that activates Vo for one of the permissible logic input states and /Vo for the other input states. The invention is applicable both to systems that provide single ended logic inputs and to systems that directly provide differential logic inputs. For single-ended inputs, inverters INV0, INV1, . . . , INVN can be tapped of f the inputs D0, D1, . . . , DN to provide the complement inputs /D0, /D1, . . . , /DN.

The following describes each of the conceptual stages in more detail. At the input stage, each differential input pair is applied to the bases of a respective differential transistor pair P0–PN. For instance, at the first transistor pair P0, input D0 is applied to the base of the input transistor Q0 and /D0 is applied to the base of the complement input transistor /Q0. The emitters of the differential transistor pairs are tied together, with respective input current source transistors Qi0, Qi1, . . . , QiN drawings currents I0, I1, . . . , IN through the input transistor pairs P0, P1, . . . , PN. These input currents are each set at a magnitude of one current unit by connecting a reference transistor Qa, which is matched in size with the input current source transistors Qi0, Qi1, . . . , QiN, to receive the unit current from the collector of current source transistor QS, and connecting the bases of the input current source transistors to the base of Qa. Since all of the input current source transistors are matched with and biased the same as the reference transistor Qa, they will each carry one unit of current, the same as Qa. The emitters of input current source transistors Qi0, Qi1, . . . , QiN are connected through respective desensitizing resistors R0, R1, . . . , RN to the negative supply bus −Vee to complete the input current circuits.

A bias voltage Vbi is generated by Qa coupled with Qs along with resistor Ra and resistor 52. The bases of Qi0–QiN are connected to common bias voltage Vbi that keeps these transistors conductive. When the transistor pairs P0–PN are close together as in the preferred embodiment of FIG. 4, the bias voltage to the transistors can be common. If the input transistor pairs P0–PN are widely separated, separate bias voltages can be provided for Qi0–QiN and Qa. In the widely separated embodiment, each transistor pair P0–PN is provided with a bias voltage tied to it's own circuit which is similar to the circuit having transistor Qa and resistors Ra. This circuit is then tied to a separate transistor and resistor circuit similar to transistor Qs and resistor 52, both the circuits being shared on a common voltage bias Vbs. Each of the transistor pairs P9–PN will then have a separate but equal current source that is equal to the unit current in transistor Qs.

In the preferred embodiment, a common base current compensation scheme can be used to provide a high accuracy current. One such conventional compensation circuit uses an npn transistor 80 having its collector grounded, it's base connected to the collector of Qa and it's emitter connected to the base of Qa, which is Vbi. The base of Qa is also connected to negative supply −Vee via a diode Dc and resistor Rc. As an alternative embodiment, the base and collector of transistor Qa are connected together providing a simple but relatively inaccurate means for providing the matching current for Qi0–QiN.

The collectors of the input transistors Q0–QN are each connected to a common input node 42 in the conversion stage 60, while the collectors of the complement input transistors /Q0–/QN are each coupled to a common complement node 44 that is also in the conversion stage.

In the input stage 30, each of the input and complement input voltages is converted to a differential current unit value at the respective differential transistor pairs P0–PN. For instance, if D0 is active Q0 will turn on and conduct one current unit I0, while its complement /D0 will be inactive and transistor /Q0 will not conduct. Conversely, if input D0 is inactive, Q0 will not conduct but input complement /D0 will be active and transistor /Q0 will conduct. The remaining differential transistor pairs P1–PN function in the same manner as pair P0, based upon their respective input signals.

Because of the restriction that only one input can be active at a time, at most only one of the input transistors Q0–QN can conduct at any time. Conversely, at least N−1 of the input complements /D0–/DN will be active at any given time, forcing either N−1 or N complement input transistors /Q0–/QN to conduct.

The current drawn from input node 42 is the sum of the currents from the active input transistors Q0–QN. It will be equal to zero when none of the inputs D0–DN are active, and to a single current unit when one of the inputs D0–DN is active. Conversely, the current drawn from complement node 44 is the sum of the currents from the active complement transistors /Q0–/QN. This current will be the sum of all current units I0–IN when all inputs D0–DN are inactive, or the N−1 current units from I0–IN when one of the inputs D0–DN is active.

This results in a current asymmetry between the input node 42 and the complement node 44. To compensate for this asymmetry, a compensation current equal to N−1 current units is generated in conversion stage 60 and sourced into complement node 44. The necessary compensation current can be different depending on the current in Qi0–QiN and the compensation current can be generated by a variety of ratio of emitter and resistor sizes. However, in the preferred embodiment, the compensation current is generated by a pnp compensation current source transistor Qc whose base is connected to the same bias Vbs as the base of current source transistor Qs, whose emitter is connected to Vcc through a resistor 62 and is scaled (N−1) times larger than the emitter of Qs, and resister 62 is scaled (N−1) times smaller than resister 52, so that Qc sources (N−1) times as much current as Qs, and whose collector is connected to provide a current magnitude of N−1 current units to the complement node 44. Since the same reference voltage Vbs is used as a reference for both the compensation current source transistor Qc and the current source transistor Qs, which is used as a reference for the input current, there is a good match between the input and compensation current. While individual local current sources could be used to generate the input currents I0–IN, decoupling these currents from the compensation current can result in a shift in the crossover point between the circuit's output states and increased sensitivity to noise.

The architecture described above which provides the N−1 current unit compensation current and the input currents to the differential transistor pairs is only one example of how these currents can be generated. There are numerous alternatives that can be used without departing from this invention. What is critical is that the input units to the differential transistor pairs maintain the proper relationship to the compensation current; i.e. N−1 input currents is the same or very close to the N−1 current unit compensation current.

At the complement node 44 the N−1 current unit compensation supplies all of the current drawn from the node by the input stage when one of the inputs is active and N−1 of the input complements /D0–/DN are active, leaving node 44 in current balance. At the same time the input stage will draw one current unit from input node 42 which must be supplied from the output stage 40. Conversely, when none of the inputs are active the input stage draws N current units from the complement node 44. Of this only N−1 current units are supplied by the compensation current, leaving a deficit of one current unit to be supplied to node 44 from the output circuit. At the same time no current is drawn from the input node 42 by the input stage, leaving that node in current balance. The conversion circuit 60 thus converts the pattern of differential input voltages, as reflected by the N differential currents produced by the input stage, into a single differential current of unit current value that is drawn from the output stage.

The output stage 40 includes a pair of npn output transistors Qop and /Qop. The emitter of transistor Qop is connected to complement node 44 and its collector is connected to positive voltage bus Vcc through a resistor 46. Similarly, the emitter of output transistor /Qop is connected to the input node 42 and its collector is connected to positive voltage bus Vcc through a resistor 47. A common bias voltage Vbo is applied to the bases of Qop and /Qop.

A differential voltage signal is generated at the collectors of Qop and /Qop which indicates the logic state of the input signals. When one of the inputs D0–DN is active, the resulting current supplied by Qop to the complement node 42 is zero, and there is no voltage drop across resistor 46. This causes the collector voltage of transistor Qop to go to a logic HI at approximately the positive Vcc supply level. At the same time, output transistor /Qop supplies one current unit to input node 42, producing a current through resistor 47 that reduces the voltage at the collector of /Qop to a logic LO below the level of Vcc. Conversely, when none of the inputs D0–DN is active the voltage at the collector of Qop is LO and the voltage at the collector of /Qop is HI. The result is a single differential voltage output that accurately reflects the restricted OR logic pattern at the multiple differential inputs.

As a higher speed alternative, current source 43 can be connected to draw a current from complement node 44 and current source 41 can be connected to draw the same current from input node 42. In this embodiment, Qop and /Qop will always be conducting. Depending on the current at the respective nodes from the transistor pairs P0–PN, the current will be increased in Qop or /Qop and the output will change accordingly. By keeping Qop and /Qop conductive, Qop and /Qop can more quickly change states.

Although the present invention has been described in considerable detail with reference to particular embodiments, other versions are possible. For example, a differential current output could be obtained if desired by utilizing the differential current, drawn by the input and complement nodes from the output circuit, as the final output. Also, while the output terminal Vo is a buffered version of HI and its complement /Vo is a buffered version of LO when an active input signal is present, this could easily be inverted if desired to have output terminal Vo go LO and /Vo go HI in the presence of an active input signal. Therefore, the invention should be limited only in terms of the appended claims.

We claim:

1. A multiple input restrictive OR circuit, comprising:
    an input stage having N differential inputs connected to receive respective input signals and their complements, only one of said input signals active at a time, each said active input signal and active input signal compliment being converted to a current unit;
    an output stage providing a differential output; and
    a conversion stage which responds to the pattern of differential input signals applied to said input stage to produce a differential converted signal that corresponds to said differential input signal pattern, said conversion stage separately summing said compliment input current units and said input currents units, said conversion stage also subtracting (N−1) current units from the sum of the compliment input current units, the resulting said summed compliment input currents and said summed input currents used by said output stage to provide said differential output.

2. The OR circuit of claim 1, wherein said input stage comprises N differential transistor pairs each connected to receive respective one of said differential inputs, each of said pairs including a respective input transistor connected to receive a respective input signal and a complement transistor connected to receive the complement of said input signal, and current sources drawing substantially equal units of current through said differential transistor pairs.

3. A multiple input restrictive OR circuit in which only one input can be active at a time, comprising:
   an input stage having N differential inputs connected to receive respective input signals and their complements, said input stage comprising N differential transistor pairs each connected to receive respective one of said differential inputs, each of said pairs including a respective input transistor connected to receive a respective input signal and a complement transistor connected to receive the complement of said input signal;
   an output stage providing a differential output; and
   a conversion stage which responds to the pattern of differential input signals applied to said input stage to produce a differential converted signal that corresponds to said differential input signal pattern, wherein said conversion stage comprises an input node connected to supply any current unit flowing through said input transistors, a complement node connected to sum the current units through said complement transistors, and a current compensation circuit connected to supply (N−1) current units to said complement node so that said input and complement nodes collectively draw a differential current that indicates the presence or absence of an active input signal at one of said input transistors.

4. The OR circuit of claim 1, wherein said conversion stage produces said differential converted signal as a differential current signal.

5. The OR circuit of claim 1, further comprising an output stage connected to transform said differential converted signal to an output differential voltage signal.

6. A multiple input restrictive OR circuit in which only one input can be active at a time, comprising:
   an input stage having N differential inputs connected to receive respective input signals and their complements;
   an output stage providing a differential output;
   a conversion stage which responds to the pattern of differential input signals applied to said input stage to produce a differential converted signal that corresponds to said differential input signal pattern; and
   said output stage connected to transform said differential converted signal to an output differential voltage signal, said output stage comprising a pair of output transistors with a common bias, said output transistors connected to supply said differential converted signal to said conversion circuit and in response thereto to produce said output differential voltage signal.

7. The OR circuit of claim 6, wherein said output circuit further comprises respective output buffer circuits buffering the outputs of said output transistors.

8. A multiple input restrictive OR circuit in which only one input can be active at a time, comprising:
   an input stage having N differential inputs connected to receive respective input signals and their complements, wherein said input stage comprises N differential transistor pairs each connected to receive respective one of said differential inputs, each of said pairs including a respective input transistor connected to receive a respective input signal and a complement transistor connected to receive the complement of said input signal, and input stage current source drawing substantially equal units of current through said differential transistor pairs;
   an output stage providing a differential output;
   a conversion stage which responds to the pattern of differential input signals applied to said input stage to produce a differential converted signal that corresponds to said differential input signal pattern;
   a current compensation circuit connected to supply (N−1) current units to the collective current units of said complement transistors so that said input and complement transistors collectively draw a differential current that indicates the presence or absence of an active input signal at one of said input transistors; and
   a common current source that generates a common unit reference current for both said input stage current sources and said compensation circuit.

9. The OR circuit of claim 8, wherein said common current source comprises a reference current source transistor which generates a unit of current, and said current compensation circuit includes a compensation current source transistor that is biased in common with said reference current source transistor and is scaled relative to said reference current source transistor to supply a compensation current to said complement node equal to (N−1) times the current unit generated by said reference source current transistor.

10. The OR circuit of claim 9, wherein said input stage includes an input current source transistor connected to receive said current unit from said reference current source transistor, said input circuit current sources connected to mirror the current through said input current source transistor.

11. A multiple input restrictive OR circuit in which only one input can be active at a time, comprising:
   N differential transistor pairs comprising an input transistor to receive an input from a differential input and a complement transistor to receive a compliment input from said differential input;
   N current sources drawing substantially equal units of current through said differential transistor pairs;
   a complement node connected to sum the current units through said compliment transistors;
   a input node connected to supply any current flowing through said input transistors;
   a conversion circuit connected to supply (n−1) current units to said complement node;
   a pair of output transistors with a common bias, said output transistors connected to supply a differential current signal to said conversion circuit and in response thereto to produce said output differential voltage signal;
   respective output buffer circuits buffering the outputs of said output transistors.

12. The OR circuit of claim 11, further comprising a common current source which provides a common unit reference current for said differential transistor pair current units and said conversion circuit current units, said common current source comprises a reference current source transistor which generates a unit of current.

13. The OR circuit of claim 11, wherein said conversion circuit comprises a compensation current source transistor that is biased in common with said reference current source transistor and is scaled relative to said reference current source transistor to supply a compensation current to said complement node equal to (N−1) times the current unit generated by said reference source current transistor.

14. The OR circuit of claim 11, wherein said input current sources are provided by an input current source transistor connected to receive said current unit from said reference current source transistor, said input current sources connected to mirror the current through said input current source transistor.

15. A method for providing a differential output that indicates the presence or absence of and active input among multiple differential inputs, comprising:

converting the input voltages into unit input current signals;

converting the complement input voltages into unit compliment current signals;

summing all said unit input current signals;

summing all said unit compliment current signals;

subtracting from said summed unit compliment current signals an opposing current such that the resulting current is zero when one of the input voltages is active or one current unit when none of the input voltages is active;

extracting an output voltage from said summed unit input current signals and said summed unit compliment current signals, said output voltages being active when said summed currents are zero.

* * * * *